(12) United States Patent
Inoue et al.

(10) Patent No.: US 10,700,148 B2
(45) Date of Patent: Jun. 30, 2020

(54) DISPLAY DEVICE

(71) Applicant: Sharp Kabushiki Kaisha, Sakai, Osaka (JP)

(72) Inventors: Satoshi Inoue, Sakai (JP); Yuhki Kobayashi, Sakai (JP); Shinichi Kawato, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/468,402

(22) PCT Filed: Sep. 29, 2017

(86) PCT No.: PCT/JP2017/035679
§ 371 (c)(1),
(2) Date: Jun. 11, 2019

(87) PCT Pub. No.: WO2019/064560
PCT Pub. Date: Apr. 4, 2019

(65) Prior Publication Data
US 2019/0305066 A1   Oct. 3, 2019

(51) Int. Cl.
*H01L 27/32* (2006.01)
*H01L 23/544* (2006.01)
(Continued)

(52) U.S. Cl.
CPC ........... *H01L 27/3262* (2013.01); *G09F 9/00* (2013.01); *G09F 9/30* (2013.01); *H01L 23/544* (2013.01);
(Continued)

(58) Field of Classification Search
None
See application file for complete search history.

(56) References Cited

U.S. PATENT DOCUMENTS

| | | | |
|---|---|---|---|
| 2006/0061524 A1* | 3/2006 | Suh | G09G 3/3216 345/76 |
| 2008/0157082 A1* | 7/2008 | Yang | H01L 27/1214 257/59 |

(Continued)

FOREIGN PATENT DOCUMENTS

| JP | 2004-341216 A | 12/2004 |
|---|---|---|
| JP | 2006-072310 A | 3/2006 |

(Continued)

OTHER PUBLICATIONS

Official Communication issued in International Patent Application No. PCT/JP2017/035679, dated Dec. 19, 2017.

*Primary Examiner* — Nishath Yasmeen
(74) *Attorney, Agent, or Firm* — Keating & Bennett, LLP

(57) ABSTRACT

Included are first light-emitting element including a first organic layer having an island shape, and a first lower electrode, an electrode cover film having an insulating property and covering an edge of the first lower electrode, and a second light-emitting element including a second organic layer that has an island shape and that is an identical layer to the first organic layer, and a second lower electrode. As an opening of the electrode cover film wholly overlaps with the first lower electrode and the first organic layer, so that the opening defines a light-emitting region of the first light-emitting elements. When the edge of the second organic layer overlaps with the second lower electrode without being interposed with an insulating film, the edge of the second organic layer defines a light-emitting region of the second light-emitting element.

17 Claims, 12 Drawing Sheets

(51) Int. Cl.
*H01L 51/50* (2006.01)
*H01L 51/52* (2006.01)
*G09F 9/30* (2006.01)
*H05B 33/22* (2006.01)
*G09F 9/00* (2006.01)
*H05B 33/12* (2006.01)
*H05B 33/10* (2006.01)
*H05B 33/02* (2006.01)
*H05B 33/14* (2006.01)

(52) U.S. Cl.
CPC .......... *H01L 27/32* (2013.01); *H01L 51/5056* (2013.01); *H01L 51/5072* (2013.01); *H01L 51/5218* (2013.01); *H01L 51/5234* (2013.01); *H05B 33/02* (2013.01); *H05B 33/10* (2013.01); *H05B 33/12* (2013.01); *H05B 33/14* (2013.01); *H05B 33/22* (2013.01); *H01L 51/5253* (2013.01); *H01L 2223/54426* (2013.01)

(56) References Cited

U.S. PATENT DOCUMENTS

| | | |
|---|---|---|
| 2014/0353598 A1 | 12/2014 | Jeong |
| 2015/0060823 A1 | 3/2015 | Furuie |
| 2016/0343944 A1 | 11/2016 | Lee et al. |
| 2018/0097050 A1* | 4/2018 | Yokota ................ H01L 27/3258 |
| 2018/0198097 A1* | 7/2018 | Lee ....................... H01L 51/001 |

FOREIGN PATENT DOCUMENTS

| | | | |
|---|---|---|---|
| JP | 2008-204767 A | | 9/2008 |
| JP | 2009-158328 A | | 7/2009 |
| JP | 2009-301768 A | | 12/2009 |
| JP | 2015-049948 A | | 3/2015 |
| KR | 10-2017-0002413 | * | 1/2017 |

\* cited by examiner

DISPLAY DEVICE

TECHNICAL FIELD

The disclosure relates to a display device.

BACKGROUND ART

PTL 1 discloses a configuration where an element for inspection purpose is provided in a frame region of a display device.

CITATION LIST

Patent Literature

PTL 1: JP 2004-341216 A (published Dec. 2, 2004)

SUMMARY

Technical Problem

For a display device in which a light-emitting element including an organic layer having an island shape is formed on a thin film transistor (TFT) layer, detection of alignment precision between the organic layer and the TFT layer has been demanded.

Solution to Problem

A display device according to an aspect of the disclosure is a display device in which a lower electrode and an upper electrode, as well as a plurality of light-emitting elements each including an organic layer having an island shape are provided on a TFT layer. The display device includes a light-emitting element for display purpose, in which an insulating film covering an edge of the lower electrode overlaps with an edge of the organic layer, and a light-emitting element for inspection purpose, in which the lower electrode overlaps with at least a part of the edge of the organic layers without being interposed with an insulating film.

Advantageous Effects of Disclosure

According to the aspect of the disclosure, alignment precision between the organic layer and the TFT layer can be detected.

BRIEF DESCRIPTION OF DRAWINGS

FIG. 3A is a plan view illustrating a configuration example of a display portion and a non-display portion of a display device. FIG. 3B is an enlarged detailed view of the non-display portion.

FIG. 4A is a cross-sectional view illustrating light-emitting elements for display purpose. FIG. 4B is a cross-sectional view illustrating light-emitting elements for inspection purpose.

FIG. 5A is a cross-sectional view illustrating light-emitting regions of the light-emitting elements for display purpose. FIG. 5B is a cross-sectional view illustrating light-emitting regions of the light-emitting elements for inspection purpose. FIG. 5C is a plan view illustrating one of the light-emitting regions of the light-emitting elements for display purpose and one of the light-emitting regions of the light-emitting elements for inspection purpose.

FIG. 7A is a plan view illustrating a configuration example of a display portion and a non-display portion of a display device. FIG. 7B is an enlarged detailed view of the non-display portion.

FIG. 8A is a cross-sectional view illustrating light-emitting elements for display purpose. FIG. 8B is a cross-sectional view illustrating light-emitting elements for inspection purpose.

FIG. 9A is a cross-sectional view illustrating light-emitting regions of the light-emitting elements for display purpose. FIG. 9B is a cross-sectional view illustrating light-emitting regions of the light-emitting elements for inspection purpose. FIG. 9C is a plan view illustrating one of the light-emitting regions of the light-emitting elements for display purpose and one of the light-emitting regions of the light-emitting elements for inspection purpose.

FIG. 10A is a plan view illustrating a configuration example of a display portion and a non-display portion of a display device. FIG. 10B is an enlarged detailed view of the non-display portion.

FIG. 11A is a cross-sectional view of light-emitting elements for inspection purpose. FIG. 11B is a cross-sectional view illustrating light-emitting regions of the light-emitting elements for inspection purpose.

FIG. 12A is a cross-sectional view of light-emitting elements for inspection purpose. FIG. 12B is a plan view of the light-emitting elements for inspection purpose. FIG. 12C is a cross-sectional view illustrating light-emitting regions of the light-emitting elements for inspection purpose.

DESCRIPTION OF EMBODIMENTS

Figure 1:
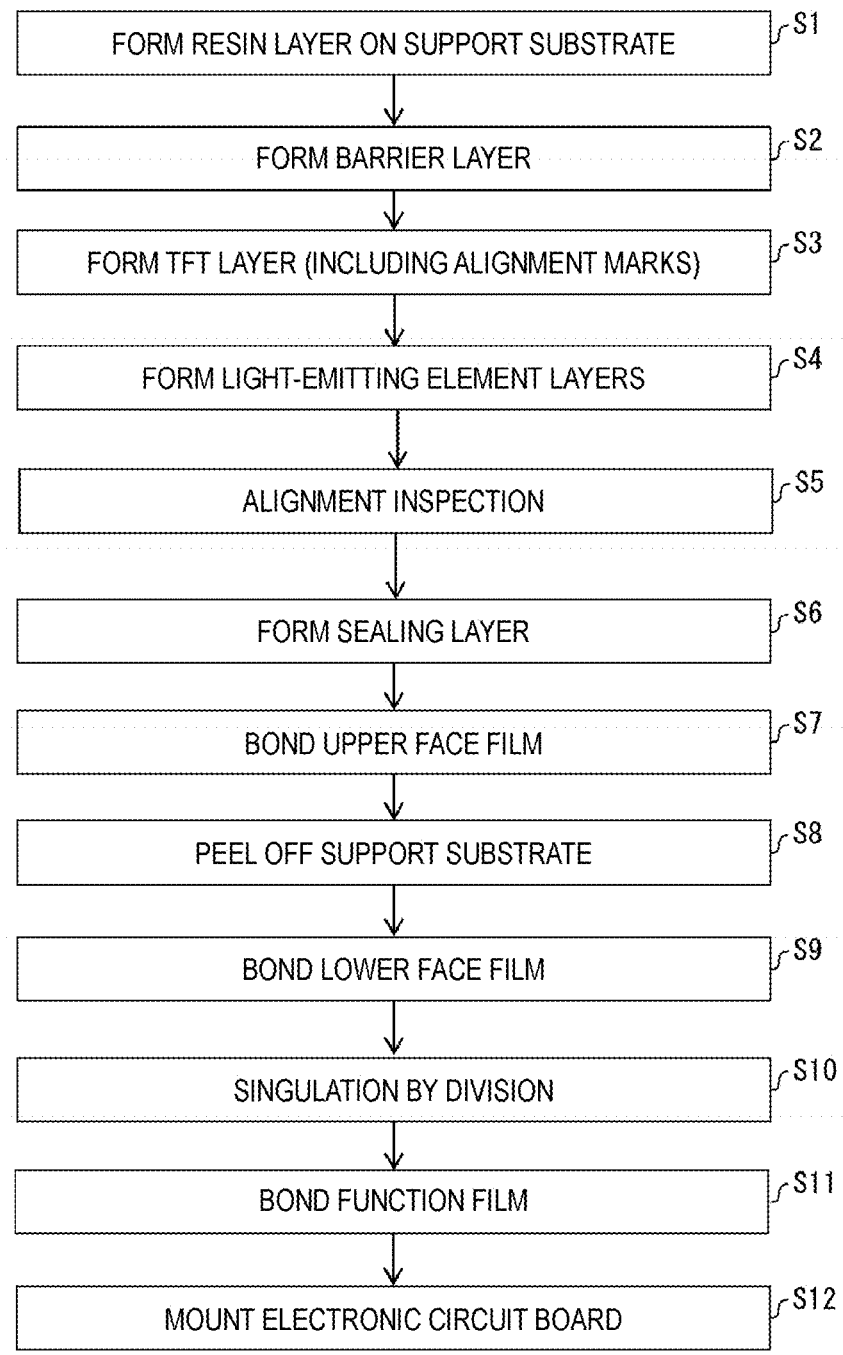
FIG. 1 is a flowchart illustrating an example of a method for manufacturing a display device.
Figure 2:
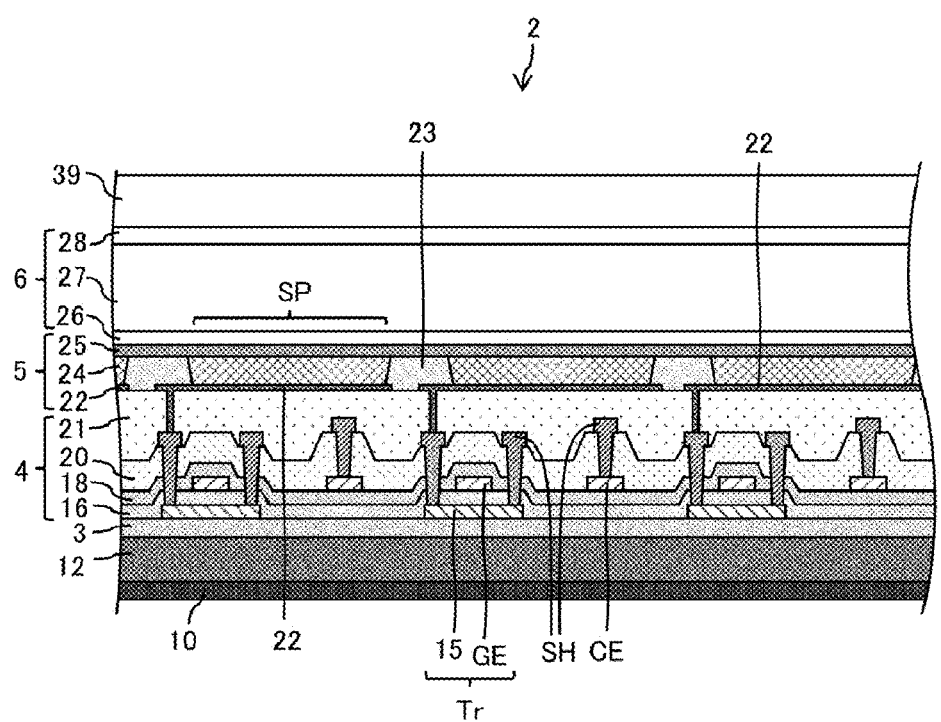
FIG. 2 is a cross-sectional view illustrating a configuration example of a display portion of the display device.

FIG. 1 is a flowchart illustrating an example of a method for manufacturing a display device. FIG. 2 is a cross-sectional view illustrating a configuration example of a display portion of the display device. Herein, an "identical layer" denotes that the subject is formed of an identical material through an identical process. A "lower layer" denotes that the subject is formed through a process before a target-comparison layer is formed. An "upper layer" denotes that the subject is formed through a process after a target-comparison layer is formed.

When a flexible display device is manufactured, as illustrated in FIGS. 1 and 2, first, a resin layer 12 is formed on a light-transmissive support substrate (for example, a mother glass substrate) (step S1). Next, a barrier layer 3 is formed (step S2). Next, a thin film transistor (TFT) layer 4 including an alignment mark is formed (step S3). Next, a top-emitting type, light-emitting element layer (for example, an organic light-emitting diode (OLED) element layer) 5 is formed (step S4). Next, an alignment inspection (detecting alignment precision on an organic layer of the light-emitting element layer with respect to the TFT layer 4) is performed (step S5). Next, a sealing layer 6 is formed (step S6). Next, an upper face film is bonded to the sealing layer 6 (step S7). Next, laser light is irradiated onto a lower face of the resin layer 12 through the support substrate to lower a bonding force between the support substrate and the resin layer 12. The support substrate is then peeled off the resin layer 12 (step S8). Next, a lower face film 10 is bonded to the lower face of the resin layer 12 (step S9). Then, a layered body including the lower face film 10, the resin layer 12, the barrier layer 3, the TFT layer 4, the light-emitting element layer 5, and the sealing layer 6 is divided. A plurality of individual pieces are then obtained (step S10). Next, a function film 39 is bonded to each of the obtained individual pieces (Step S11). Next, an electronic circuit board (for example, integrated circuit (IC) chip) is mounted to terminals for external coupling purpose to achieve a display device 2 (step S12). Note that each of the above-described steps is performed by a display device manufacturing apparatus, described later.

Examples of the material used in the resin layer 12 include polyimide. Examples of the material used in the lower face film 10 include polyethylene terephthalate (PET).

The barrier layer 3 is a layer that prevents foreign matters such as moisture and oxygen from penetrating the TFT layer 4 and the light-emitting element layer 5 when the display device 2 is being used, and can be formed from a silicon oxide film, a silicon nitride film, or a silicon oxinitride film, or from a layered film thereof, through chemical vapor deposition (CVD), for example.

The TFT layer 4 includes a semiconductor film 15, an inorganic insulating film 16 (a gate insulating film) that is an upper layer than the semiconductor film 15, a gate electrode GE that is an upper layer than the inorganic insulating film 16, an inorganic insulating film 18 that is an upper layer than the gate electrode GE, a capacitance wiring line CE that is an upper layer than the inorganic insulating film 18, an inorganic insulating film 20 that is an upper layer than the capacitance wiring line CE, a source wiring line SH that is an upper layer than the inorganic insulating film 20, and a flattering film 21 that is an upper layer than the source wiring line SH.

A thin film transistor (TFT) Tr includes the semiconductor film 15, the inorganic insulating film 16 (the gate insulating film), and the gate electrode GE.

The semiconductor film 15 is formed of, for example, low temperature polysilicon (LTPS) or an oxide semiconductor. Note that, in FIG. 2, the TFT is illustrated that has a top gate structure in which the semiconductor film 15 serve as a channel. However, the TFT may have a bottom gate structure (when TFT channel is an oxide semiconductor, for example).

The gate electrode GE, the capacitance wiring line CE, and the source wiring line SH are each formed from a single layer metal film or a layered metal film, for example. The metal is at least one metal selected from aluminum (Al), tungsten (W), molybdenum (Mo), tantalum (Ta), chromium (Cr), titanium (Ti), and copper (Cu), for example.

The inorganic insulating films 16, 18, and 20 can be formed from a silicon oxide (SiOx) film or a silicon nitride (SiNx) film, or a layered film thereof, through CVD. The flattering film (interlayer insulating film) 21 can be formed of a coatable photosensitive organic material such as polyimide or acrylic, for example.

The light-emitting element layer 5 (for example, an organic light-emitting diode layer) includes an anode (anode electrode) 22 that is an upper layer than the flattering film 21, an anode cover film 23 covering an edge of the anode 22, an electroluminescence (EL) layer 24 that is an upper layer than the anode 22, and a cathode 25 that is an upper layer than the EL layer 24. Each subpixel is provided with a light-emitting element (for example, an organic light-emitting diode (OLED)) including the anode 22 having an island shape, the EL layer 24, and the cathode (cathode electrode) 25, as well as provided with a subpixel circuit configured to drive the light-emitting element.

The anode cover film 23 is an organic insulating film, and is formed through application of a photosensitive organic material such as polyimide or acrylic, and then through patterning based on a photolithographic method, for example.

For example, the EL layer 24 is formed by laminating, from a lower layer side, a hole transport layer, a light-emitting layer, and an electron transport layer in this order (described later). The light-emitting layer is formed in an island shape per subpixel through vapor deposition or an ink-jet method. The hole transport layer and the electron transport layer may be respectively formed in island shapes respectively corresponding to subpixels, or may be formed in a solid-like manner as a common layer for a plurality of subpixels.

The anode 22 is photoreflective, and is formed of indium tin oxide (ITO) and an alloy containing Ag laminated with each other. The cathode 25 can be formed of a light-transmissive conductive material such as an MgAg alloy (ultra-thin film), indium tin oxide (ITO), or indium zinc oxide (IZO).

In the case that the light-emitting element layer 5 is formed from an OLED layer, positive holes and electrons recombine inside the EL layer 24 with a drive current between the anode 22 and the cathode 25. Light is thus emitted as excitons generated through the recombination each fall into a ground state. Since the cathode 25 is light-transmissive, and the anode 22 are light-reflective, light emitted from the EL layer 24 travels upward, achieving top emission.

The sealing layer 6 includes an inorganic sealing film 26 that is an upper layer than the cathode 25, an organic sealing film 27 that is an upper layer than the inorganic sealing film 26, and an inorganic sealing film 28 that is an upper layer than the organic sealing film 27. The sealing layer 6 prevents foreign matters such as moisture and oxygen from penetrating the light-emitting element layer 5. The inorganic sealing films 26 and 28 may be respectively formed from silicon oxide films, silicon nitride films, or silicon oxynitride films, or a layered film thereof, through CVD, for example. The organic sealing film 27 may be formed of a coatable photosensitive organic material such as acrylic.

After the support substrate has been peeled off, the lower face film 10 is bonded to the lower face of the resin layer 12 to achieve a display device having excellent flexibility. Examples of a material of the lower face film 10 include PET. The function film 39 has an optical compensation function, a touch sensor function, and a protection function, for example.

Above, the explanation is given for a case of manufacturing the flexible display device, but when a non-flexible display device is to be manufactured, since replacement of the substrate and the like is not required, the process may advance from step S6 to step S10 illustrated in FIG. 1, for example.

First Embodiment

Figure 3A:
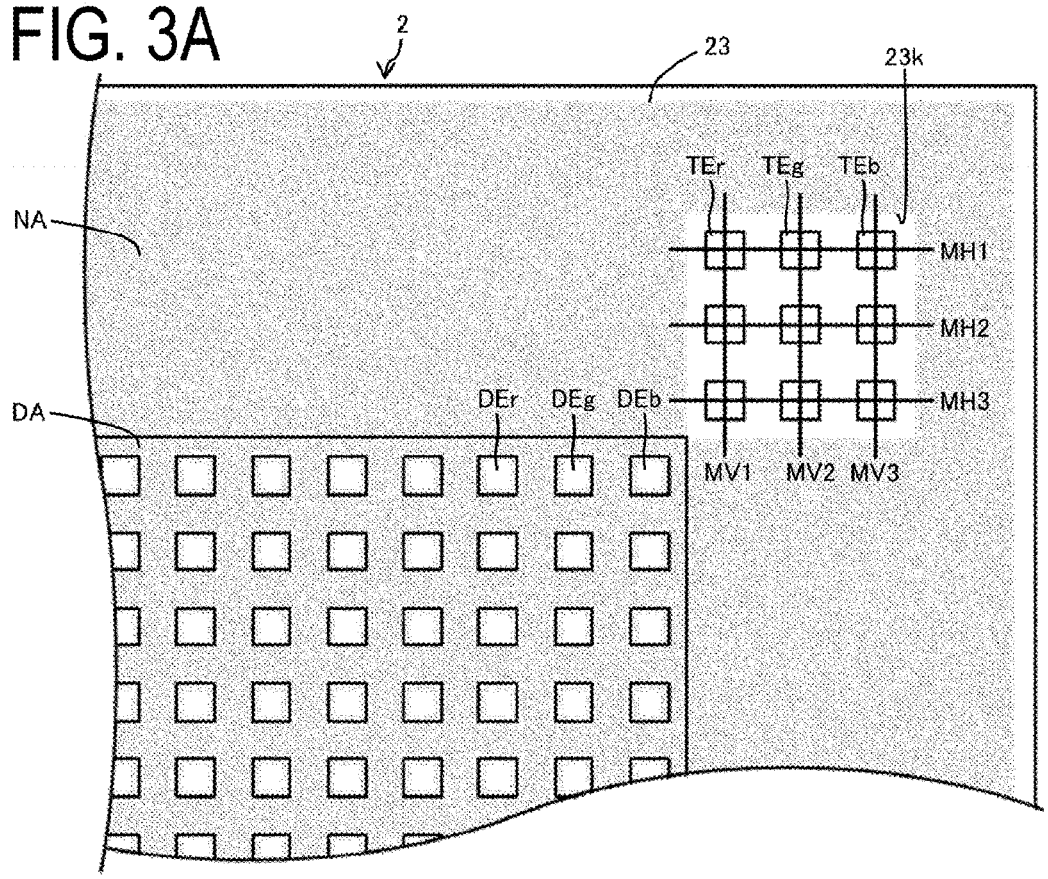
FIGS. 3A and 3B illustrate the first embodiment.
Figure 3B:
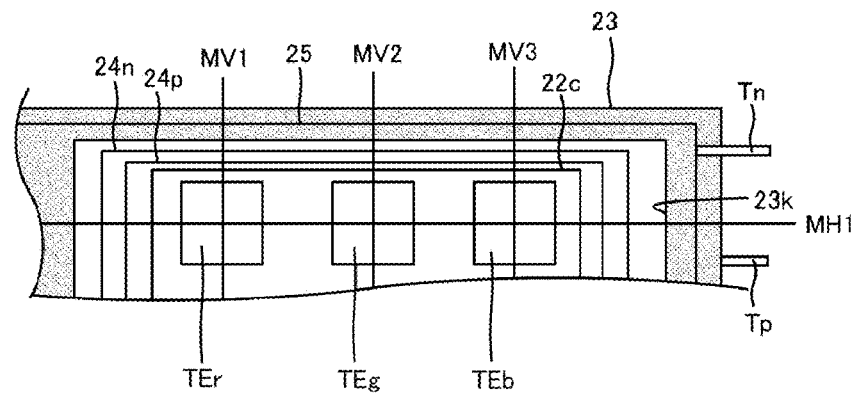
Figure 4A:
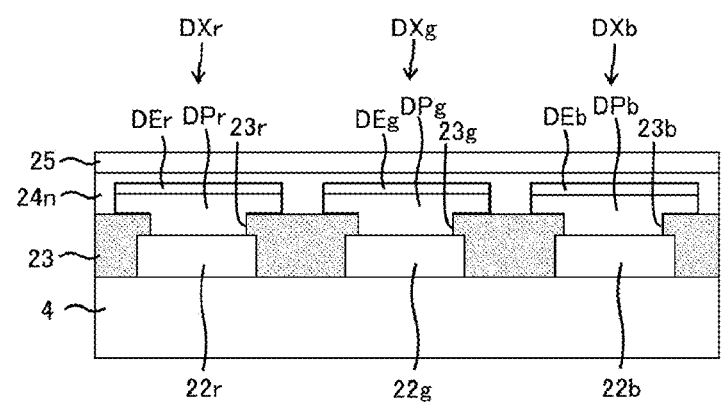
FIGS. 4A and 4B illustrate the first embodiment.
Figure 4B:
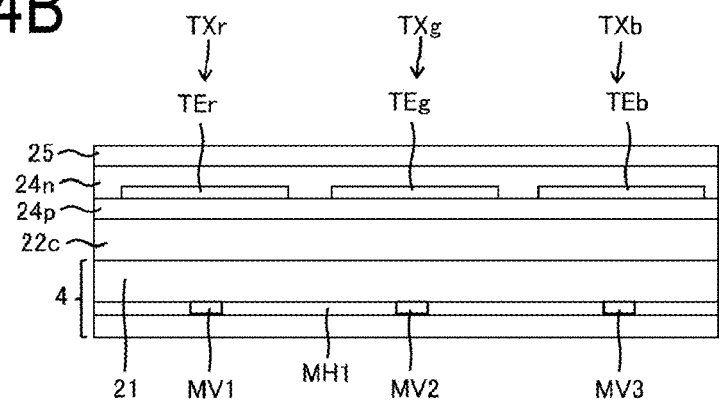
Figure 5A:
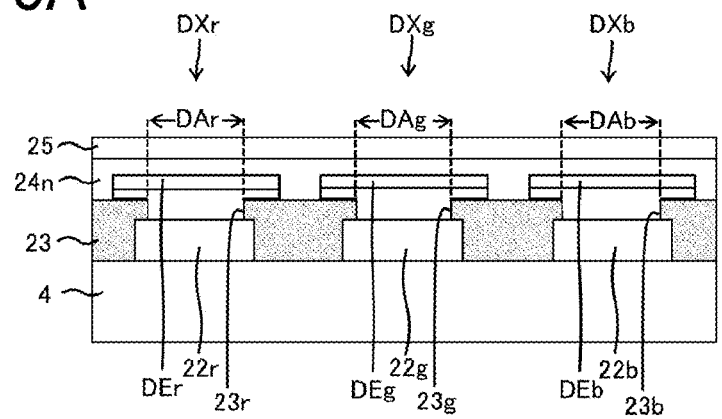
FIGS. 5A, 5B, and 5C illustrate the first embodiment.
Figure 5B:
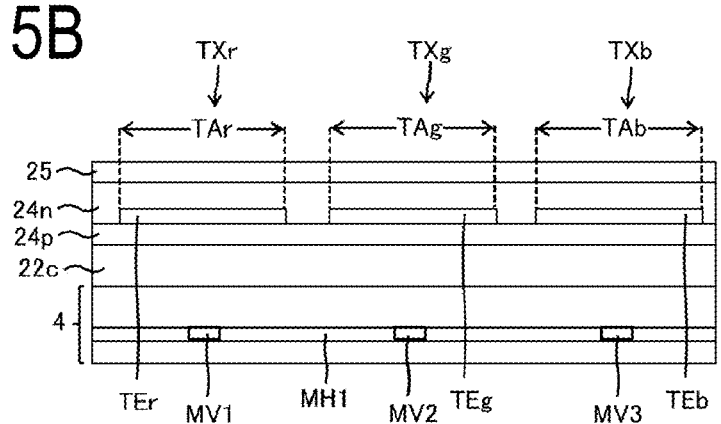
Figure 5C:
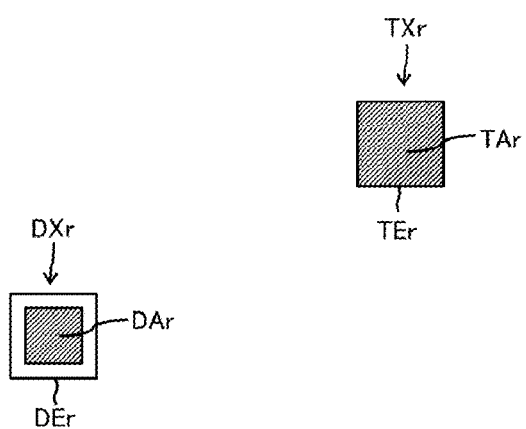

FIG. 3A is a plan view illustrating a configuration example of a display portion and a non-display portion of a display device. FIG. 3B is an enlarged detailed view of the non-display portion. FIG. 4A is a cross-sectional view illustrating light-emitting elements for display purpose. FIG. 4B is a cross-sectional view illustrating light-emitting elements for inspection purpose. FIG. 5A is a cross-sectional view illustrating light-emitting regions of the light-emitting elements for display purpose. FIG. 5B is a cross-sectional view illustrating light-emitting regions of the light-emitting elements for inspection purpose. FIG. 5C is a plan view illustrating one of the light-emitting regions of the light-emitting elements for display purpose and one of the light-emitting regions of the light-emitting elements for inspection purpose. In the first embodiment, a difference in position (difference in vapor-deposition) among the light-emitting layers is detected.

As illustrated in FIGS. 3A and 3B, a display portion DA of the display device 2 is formed with a light-emitting layer DEr having an island shape and configured to emit red light, a light-emitting layer DEg having an island shape and configured to emit green light, and a light-emitting layer DEb having an island shape and configured to emit blue light. A non-display portion NA of the display device 2 is formed with a light-emitting layer TEr having an island shape and configured to emit red light, a light-emitting layer TEg having an island shape and configured to emit green light, and a light-emitting layer TEb having an island shape and configured to emit blue light.

The light-emitting layers (DEr, DEg, DEb, TEr, TEg, and TEb) are organic layers, and are pattern-formed per color through vapor-deposition using fine metal masks (FMMs), for example. That is, the light-emitting layer DEr and the light-emitting layer TEr are vapor-deposited through a single process (by using a single mask), and then the light-emitting layer DEg and the light-emitting layer TEg are vapor-deposited through another single process (by using a single mask). Next, the light-emitting layer DEb and the light-emitting layer TEb are vapor-deposited through a single process (by using a single mask).

As illustrated in FIGS. 3A, 3B, and 4A, the light-emitting element layer 5 in FIG. 2 is formed with a light-emitting element DXr including an anode 22r (lower electrodes) having an island shape, a hole transport layer DPr having an island shape, the light-emitting layer DEr, an electron transport layer 24n, and the cathode 25 (upper electrode), a light-emitting element DXg including an anode 22g having an island shape, a hole transport layer DPg having an island shape, the light-emitting layer DEg, the electron transport layer 24n, and the cathode 25, and a light-emitting element DXb including an anode 22b having an island shape, a hole transport layer DPb having an island shape, the light-emitting layer DEb, the electron transport layer 24n, and the cathode 25. The light-emitting elements DXr, DXg, and DXb are the light-emitting elements for display purpose formed in the display portion DA. The electron transport layer 24n and the cathode 25 are common layers shared among the light-emitting elements for display purpose.

Furthermore, as illustrated in FIGS. 3A, 3B, and 4B, the light-emitting element layer 5 in FIG. 2 is formed with a light-emitting element TXr including an anode 22c (lower electrode), a hole transport layer 24p, the light-emitting layer TEr, the electron transport layer 24n, and the cathode 25 (upper electrode), a light-emitting element TXg including the anode 22c, the hole transport layer 24p, the light-emitting layer TEg, the electron transport layer 24n, and the cathode 25, and a light-emitting element TXb including the anode 22c, the hole transport layer 24p, the light-emitting layer TEb, the electron transport layer 24n, and the cathode 25. The light-emitting elements TXr, TXg, and TXb are the light-emitting elements for inspection purpose formed in the non-display portion NA. The anode 22c, the hole transport layer 24p, the electron transport layer 24n, and the cathode 25 are common layers shared among the light-emitting elements for inspection purpose. The anode 22c is coupled to a terminal Tp. The cathode 25 is coupled to a terminal Tn.

The TFT layer 4 is formed with marking wiring lines MV1 to MV3 extending in a column direction and marking wiring lines MH1 to MH3 extending in a row direction. For example, an intersection between the marking wiring line MV1 and the marking wiring line MH1 serves as an alignment mark corresponding to the light-emitting layer TEr. An intersection between the marking wiring line MV2 and the marking wiring line MH1 serves as an alignment mark corresponding to the light-emitting layer TEg. An intersection between the marking wiring line MV3 and the marking wiring line MH1 serves as an alignment mark corresponding to the light-emitting layer TEb. Each of the marking wiring lines and the source wiring line SH in FIG. 2 are formed on an identical layer, for example.

In the first embodiment, as illustrated in FIGS. 3A, 3B, 4A, and 4B, the anode in the display portion DA and an opening of the anode cover film 23 overlap with each other. An opening 23k of the anode cover film 23 is provided in the non-display portion NA. The light-emitting layers TEr, TEg, and TEb for inspection purpose are formed inside the opening 23k in a plain view.

As for the light-emitting element DXr for display purpose, an edge of the light-emitting layer DEr overlaps with the anode cover film 23. As for the light-emitting element TXr for inspection purpose, however, the light-emitting layer TEr wholly (whole areas including the edge) overlaps with the anode 22c via the hole transport layer 24p without being interposed with an insulating film of a light-emitting element layer. The light-emitting layer TEr wholly (whole areas including the edge) overlaps with the cathode 25 via the electron transport layer 24n. In the light-emitting elements for inspection purpose, the hole transport layer 24p and the electron transport layer 24n are arranged between the anode 22c and the cathode 25. The anode 22c wholly overlaps with the hole transport layer 24p and the electron transport layer 24n. Therefore, the hole transport layer 24p (function layer) and the electron transport layer 24n (function layer) prevent an anode edge from being short-circuited.

As illustrated in FIGS. 5A to 5C, in the light-emitting element DXr for display purpose, the edge of the light-emitting layer DEr and an edge of a light-emitting region DAr do not align with each other. However, in the light-emitting element TXr for inspection purpose, an edge of the light-emitting layer TEr and an edge of light-emitting region TAr align with each other. In other words, an opening 23r of the anode cover film 23 wholly overlap with the anode 22r (first lower electrode) and the light-emitting layer DEr (first organic layer), and the opening 23r defines the light-emitting region DAr of the light-emitting element DXr (first light-emitting element). The edge of the light-emitting layer TEr (second organic layer) overlaps with the anode 22c (second lower electrode) without being interposed with the anode cover film 23 (insulating film), and the edge of the light-emitting layer TEr (second organic layers) defines the light-emitting region TAr of the light-emitting element TXr (second light-emitting element).

When a current having a predetermined value is allowed to flow from the anode 22c to the cathode 25, and the light-emitting element TXr is allowed to emit light to measure a positional relationship between the edge of the light-emitting region TAr and the alignment mark (the intersection between the marking wiring line MV1 and the marking wiring line MH1), a difference in position (alignment precision) of the light-emitting layer DEr vapor-deposited by using a single mask also used for the light-emitting layer TEr can be detected (alignment inspection in FIG. 1). The light-emitting region denotes a region having predetermined brightness corresponding to a current having the predetermined value (regions superimposed with the anode 22c, the hole transport layer 24p, the light-emitting layer DEr, the electron transport layer 24n, and the cathode).

As for the light-emitting element TXg (third light-emitting element) including the light-emitting layer TEg (third organic layer) that is identical layer to the light-emitting layer TEr (second organic layer), an edge of the light-emitting layer TEg overlaps with the anode 22c (the anode shared by the second lower electrode and the light-emitting elements TXr, TXr, and TXb) without being interposed with an insulating film. The edge of the light-emitting layer TEg therefore defines a light-emitting region TAg of the light-emitting element TXg.

The light-emitting layer DEr in the light-emitting element DXr and the light-emitting layer TEr in the light-emitting element TXr are respectively formed into shapes identical to each other. Edge portion of the light-emitting layer DEr (overlaps with the anode cover film 23) does not allow a current to flow. Edge portion of the light-emitting layer TEr (does not overlap with an insulating film) allow a current to flow. Therefore, the light-emitting region TAr of the light-emitting element TXr is greater than the light-emitting region DAr of the light-emitting element DXr.

This is similar to the light-emitting element DXg (for display purpose) and the light-emitting element TXg (for inspection purpose) where light-emitting layer is formed with a single mask. This is also similar to the light-emitting element DXb (for display purpose) and the light-emitting element TXb (for inspection purpose) where light-emitting layer is formed with a single mask.

In an alignment inspection, the light-emitting element for inspection purpose is applied with a current to flow to emit light. Providing the light-emitting layer for inspection purpose adjacent to a display portion beneficially reduces a non-display portion (frame) in size. In a method where the light-emitting layer for inspection purpose is irradiated with ultraviolet light to emit light, the light-emitting layer for inspection purpose is required to be formed away from a display portion to prevent the display portion from being irradiated with the ultraviolet light, problematically expanding a frame.

In FIGS. 4A and 4B, the anode serve as a lower electrode, whereas the cathode serves as an upper electrode. However, the cathode may serve as the lower electrode, whereas an anode may serve as an upper electrode. The light-emitting layer DEr in the light-emitting element DXr and the light-emitting layer TEr in the light-emitting element TXr may respectively have shapes different from each other (in particular, when the both layers are separated away from each other). The TFT layer 4 may not be provided with alignment marks per light-emitting element for inspection purpose. For example, an alignment mark may be provided and shared by the three light-emitting elements TXr, TXg, and TXb. Terminal wiring lines in the non-display portion NA may serve as marking wiring lines, for example.

Figure 6:
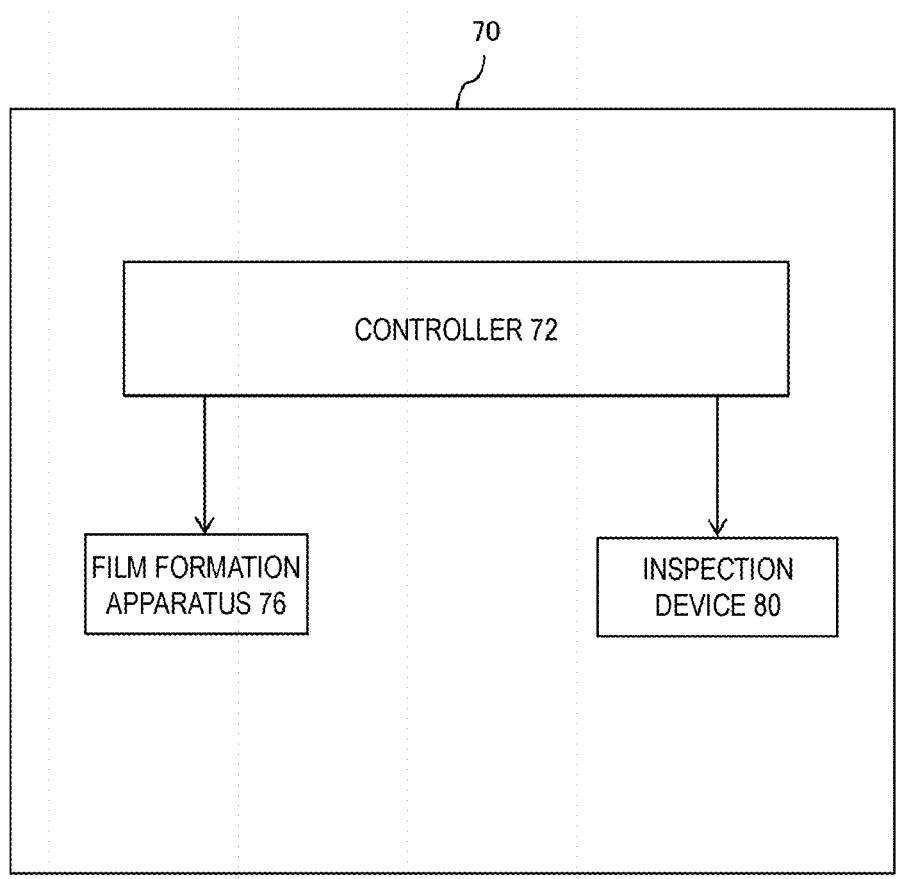
FIG. 6 is a block diagram illustrating a configuration example of a display device manufacturing apparatus.

FIG. 6 is a block diagram illustrating a configuration of a display device manufacturing apparatus. As illustrated in FIG. 6, a display device manufacturing apparatus 70 includes a film formation apparatus 76, an inspection device 80, and a controller 72 configured to control the devices. The film formation apparatus 76 performs steps S1 to S4 illustrated in FIG. 1, while the inspection device 80 performs step S5.

Second Embodiment

Figure 7A:
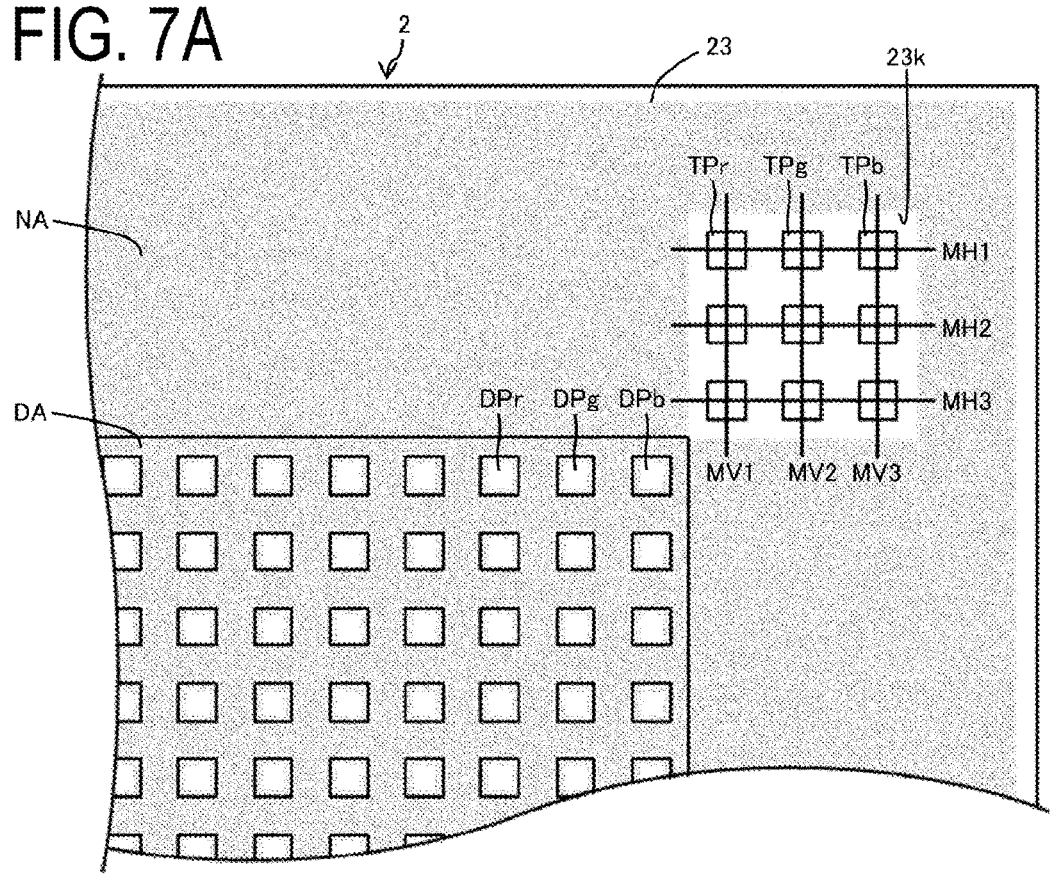
FIGS. 7A and 7B illustrate the second embodiment.
Figure 7B:
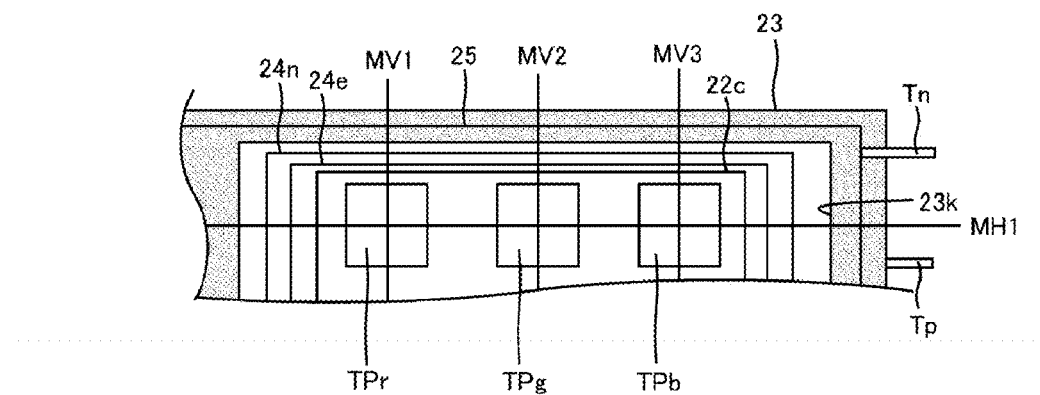
Figure 8A:
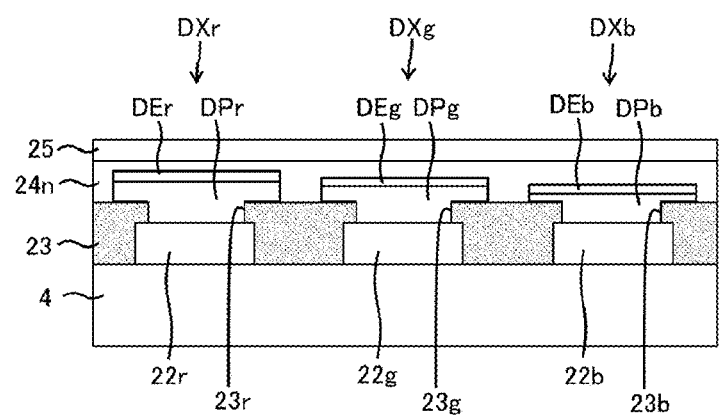
FIGS. 8A and 8B illustrate the second embodiment.
Figure 8B:
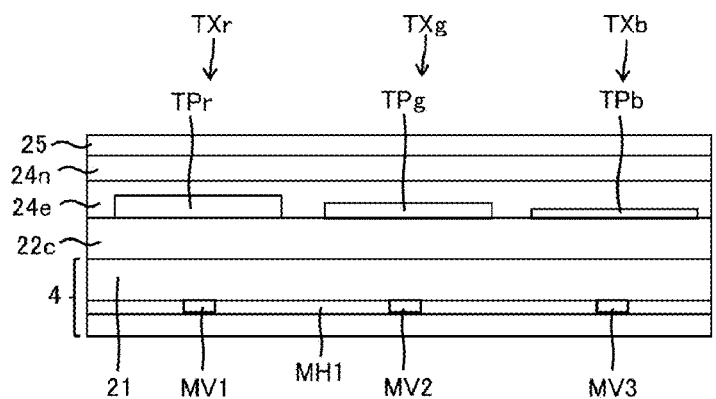
Figure 9A:
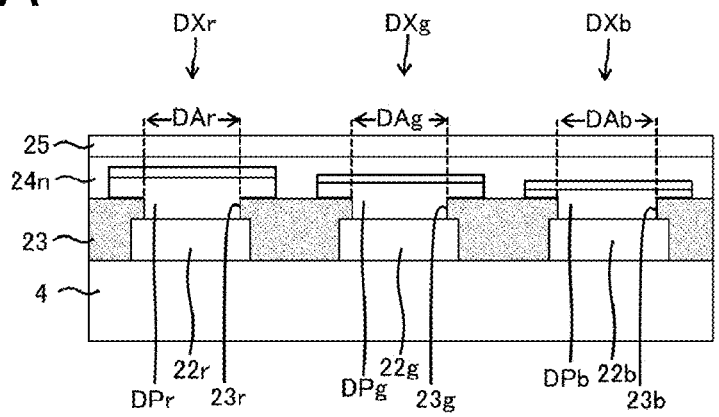
FIGS. 9A, 9B, and 9C illustrate the second embodiment.
Figure 9B:
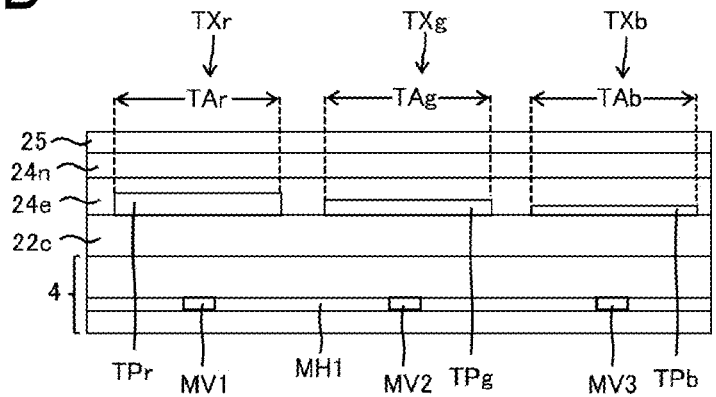
Figure 9C:
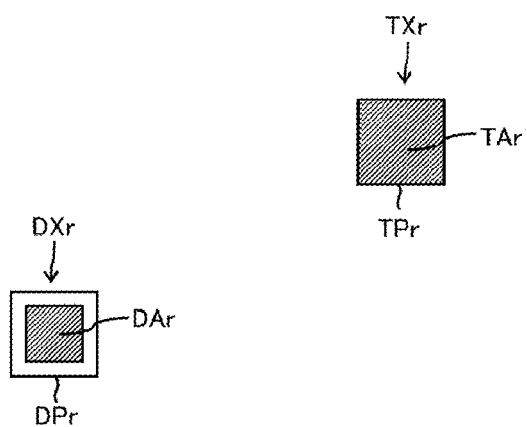

FIG. 7A is a plan view illustrating a configuration example of a display portion and a non-display portion of a display device. FIG. 7B is an enlarged detailed view of the non-display portion. FIG. 8A is a cross-sectional view illustrating light-emitting elements for display purpose. FIG. 8B is a cross-sectional view illustrating light-emitting elements for inspection purpose. FIG. 9A is a cross-sectional view illustrating light-emitting regions of the light-emitting elements for display purpose. FIG. 9B is a cross-sectional view illustrating light-emitting regions of the light-emitting elements for inspection purpose. FIG. 9C is a plan view illustrating one of the light-emitting regions of the light-emitting elements for display purpose and one of the light-emitting regions of the light-emitting elements for inspection purpose. In the second embodiment, a difference in position (difference in vapor-deposition) of the hole transport layer is detected.

As illustrated in FIGS. 7A and 7B, a display portion DA of a display device 2 is formed with a hole transport layer DPr having an island shape and serving as a red light-emitting layer, a hole transport layer DPg having an island shape and serving as a green light-emitting layer, and a hole transport layer DPb having an island shape and serving as a blue light-emitting layer. A non-display portion NA of the display device 2 is formed with a hole transport layer TPr having an island shape and serving as a red light-emitting layer, a hole transport layer TPg having an island shape and serving as a green light-emitting layer, and a hole transport layer TPb having an island shape and serving as a blue light-emitting layer.

The hole transport layers (DPr, DPg, DPb, TPr, TPg, and TPb) are organic layers, and are pattern-formed per corresponding color through vapor-deposition using fine metal masks (FMMs), for example. That is, the hole transport layer DPr and the hole transport layer TPr respectively serving as red light-emitting layers are vapor-deposited through a single process (by using a single mask), and then the hole transport layer DPg and the hole transport layer TPg respectively serving as green light-emitting layers are vapor-deposited through another single process (by using a single mask). Next, the hole transport layer DPb and the hole transport layer TPb respectively serving as blue light-emitting layers are vapor-deposited through a single process (by using a single mask).

As illustrated in FIGS. 7A, 7B, and 8A, a light-emitting element layer 5 in FIG. 2 is formed with the light-emitting element DXr including the anode 22r having an island shape, the hole transport layer DPr having an island shape, the light-emitting layer DEr, an electron transport layer 24n, and a cathode 25, the light-emitting element DXg including the anode 22g having an island shape, the hole transport layer DPg having an island shape, the light-emitting layer DEg, the electron transport layer 24n, and the cathode 25, and the light-emitting element DXb including the anode 22b having an island shape, the hole transport layer DPb having an island shape, the light-emitting layer DEb, the electron transport layer 24n, and the cathode 25. The light-emitting elements DXr, DXg, and DXb are the light-emitting elements for display purpose formed in the display portion DA.

The electron transport layer 24n and the cathode 25 are common layers shared among the light-emitting elements for display purpose.

Furthermore, as illustrated in FIGS. 7A, 7B, and 8B, the light-emitting element layer 5 in FIG. 2 is formed with the light-emitting element TXr including an anode 22c, the hole transport layer TPr, a light-emitting layer 24e, the electron transport layer 24n, and the cathode 25, the light-emitting element TXg including the anode 22c, the hole transport layer TPg, the light-emitting layer 24e, the electron transport layer 24n, and the cathode 25, and the light-emitting element TXb including the anode 22c, the hole transport layer TPb, the light-emitting layer 24e, the electron transport layer 24n, and the cathode 25. The light-emitting elements TXr, TXg, and TXb are the light-emitting elements for inspection purpose formed in the non-display portion NA. The anode 22c, the light-emitting layer 24e, the electron transport layer 24n, and the cathode 25 are common layers shared among the light-emitting elements for inspection purpose. The anode 22c is coupled to a terminal Tp. The cathode 25 is coupled to a terminal Tn.

In the second embodiment, as illustrated in FIGS. 7A, 7B, 8A, and 8B, the anode in the display portion DA and the opening of the anode cover film 23 overlap with each other. The opening 23k of the anode cover film 23 is provided in the non-display portion NA. The hole transport layers TPr, TPg, and TPb for inspection purpose are formed inside the opening 23k in a plain view.

As for the light-emitting element DXr for display purpose, the edge of the hole transport layer DPr overlaps with the anode cover film 23. As for the light-emitting element TXr for inspection purpose, however, the hole transport layer TPr wholly (whole areas including the edge) overlaps with the anode 22c without being interposed with an insulating film of a light-emitting element layer. The hole transport layer TPr wholly (whole areas including the edge) overlaps with the cathode 25 via the light-emitting layer 24e and the electron transport layer 24n. In the light-emitting element for inspection purpose, the light-emitting layer 24e and the electron transport layer 24n are arranged between the anode 22c and the cathode 25. The anode 22c wholly overlaps with the light-emitting layer 24e and the electron transport layer 24n. Therefore, the light-emitting layer 24e (function layer) and the electron transport layer 24n (function layer) prevent anode edges from being short-circuited.

As illustrated in FIGS. 9A to 9C, in the light-emitting element DXr for display purpose, the edge of the hole transport layer DPr and the light-emitting region DAr do not align with each other. However, in the light-emitting element TXr for inspection purpose, the edge of the hole transport layer TPr and the edge of light-emitting region TAr align with each other. In other words, the opening 23r of the anode cover film 23 wholly overlaps with the anode 22r (first lower electrode) and the hole transport layer DPr (first organic layer), and the opening 23r defines the light-emitting region DAr of the light-emitting element DXr (first light-emitting element). The edge of the hole transport layer TPr (second organic layer) overlaps with the anode 22c (second lower electrode) without being interposed with the anode cover film 23 (insulating film), and the edge of the hole transport layer TPr (second organic layer) defines the light-emitting region TAr of the light-emitting element TXr (second light-emitting element).

When a current is allowed to flow from the anode 22c to the cathode 25, and the light-emitting element TXr is allowed to emit light to measure a positional relationship between the edge of the light-emitting region TAr and the alignment mark (the intersection between the marking wiring line MV1 and the marking wiring line MH1), a difference in position of the hole transport layer DPr vapor-deposited by using a single mask also used for the hole transport layer TPr can be detected (alignment inspection in FIG. 1).

The hole transport layer DPr in the light-emitting element DXr and the hole transport layer TPr in the light-emitting element TXr are respectively formed into shapes identical to each other. The edge portion of the hole transport layer DPr (overlaps with the anode cover film 23) does not allow a current to flow. The edge portion of the hole transport layer TPr (does not overlap with an insulating film) allows a current to flow. Therefore, the light-emitting region TAr of the light-emitting element TXr is greater than the light-emitting region DAr of the light-emitting element DXr.

This is similar to the light-emitting element DXg (for display purpose) and the light-emitting element TXg (for inspection purpose) where light-emitting layer is formed with a single mask. This is also similar to the light-emitting element DXb (for display purpose) and the light-emitting element TXb (for inspection purpose) where light-emitting layer is formed with a single mask.

Even in the second embodiment, the light-emitting element for inspection purpose is applied with a current to flow to emit light. Providing the hole transport layer for inspection purpose adjacent to a display portion beneficially reduces a non-display portion (frame) in size.

Third Embodiment

Figure 10A:
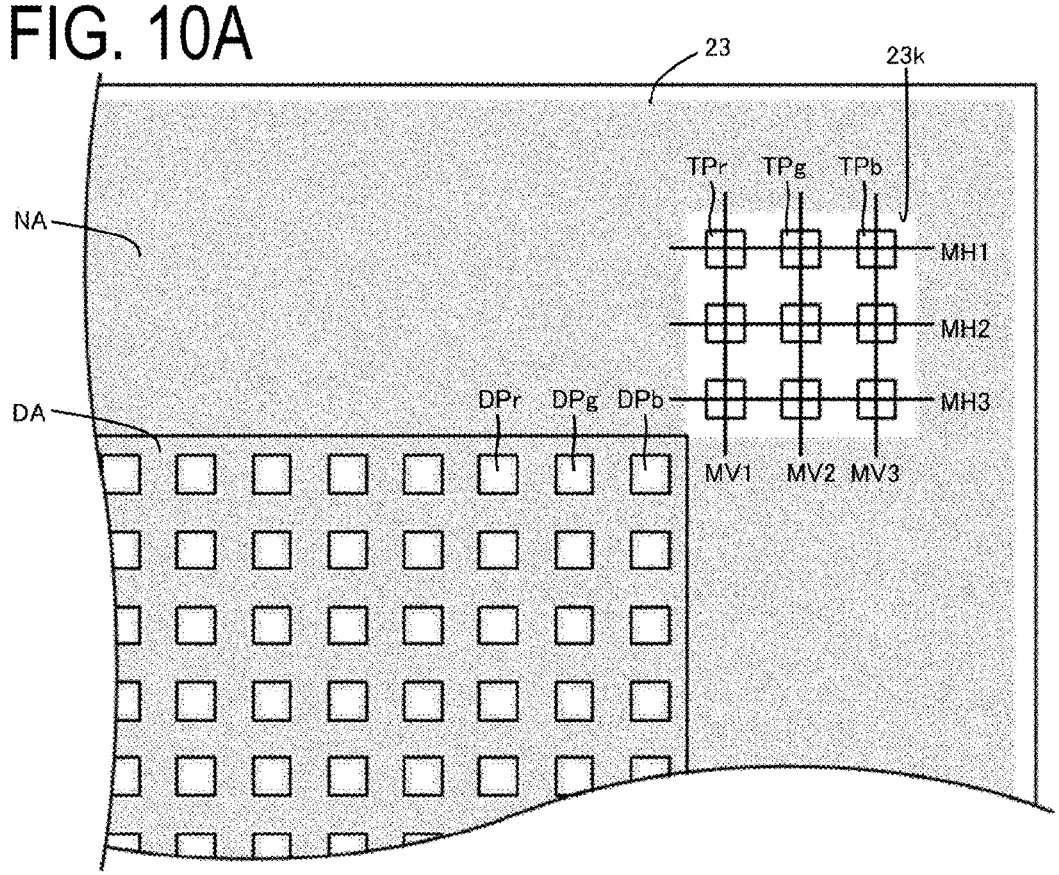
FIGS. 10A and 10B illustrate the third embodiment.
Figure 10B:
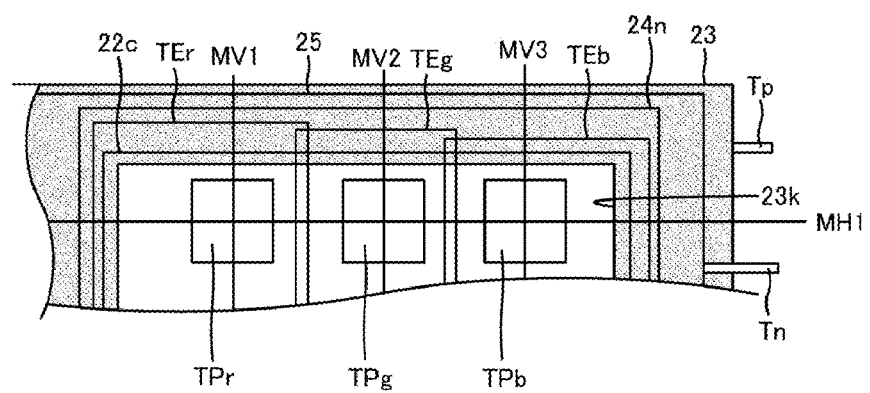
Figure 11A:
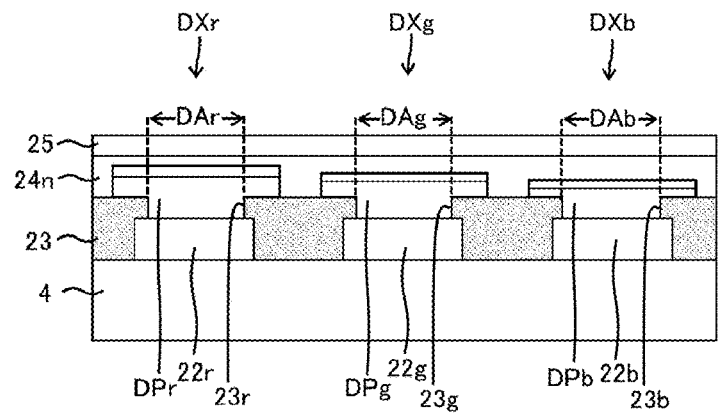
FIGS. 11A and 11B illustrate the third embodiment.
Figure 11B:
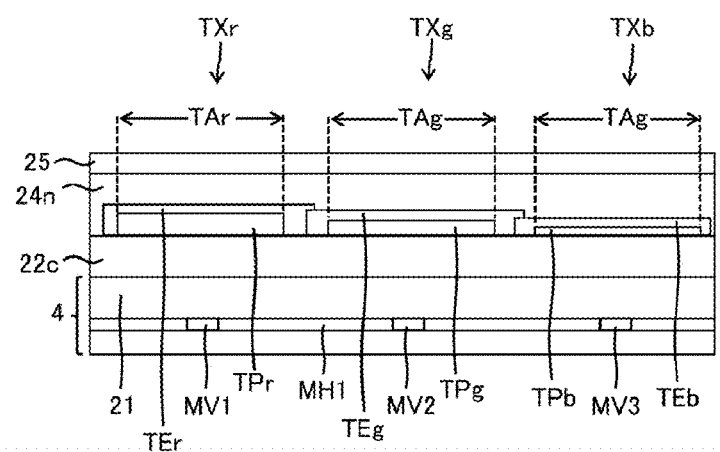

FIG. 10A is a plan view illustrating a configuration example of a display portion and a non-display portion of a display device. FIG. 10B is an enlarged detailed view of the non-display portion. FIG. 11A is a cross-sectional view illustrating light-emitting elements for display purpose. FIG. 11B is a cross-sectional view illustrating light-emitting elements for inspection purpose. In the third embodiment, a difference in position (difference in vapor-deposition) among hole transport layers is detected.

The light-emitting elements for inspection purpose (TXr, TXg, and TXb) according to the second embodiment share the light-emitting layer 24e. However, as illustrated in FIGS. 10A, 10B, 11A, and 11B, the light-emitting layer TEr having an island shape may be formed to cover the hole transport layer TPr having an island shape, the light-emitting layer TEg having an island shape may be formed to cover the hole transport layer TPg having an island shape, and the light-emitting layer TEb having an island shape may be formed to cover the hole transport layer TPb having an island shape. The anode cover film 23 covers the edge of the anode 22c. The opening 23k of the anode cover film 23 wholly overlaps with the anode 22c. The hole transport layers TPr, TPg, and TPb each having an island shape are formed inside the opening 23k of the anode cover film 23 in a plain view.

For example, as for the light-emitting element TXr for inspection purpose, the hole transport layer TPr wholly (whole areas including the edge) overlaps with the anode 22c without being interposed with an insulating film of a light-emitting element layer. The hole transport layer TPr wholly (whole areas including the edge) overlaps with a cathode 25 via the light-emitting layer TEr and an electron transport layer 24n.

In the light-emitting element TXr, the edge of the hole transport layer TPr and the edge of light-emitting region TAr align with each other. When a current is allowed to flow from the anode 22c to the cathode 25, and the light-emitting element TXr is allowed to emit light to measure a positional relationship between the edge of the light-emitting region TAr and the alignment mark (the intersection between the marking wiring line MV1 and the marking wiring line MH1), a difference in position of the hole transport layer (the hole transport layer vapor-deposited by using a single mask also used for the hole transport layer TPr) in the display portion can be detected. The light-emitting region denotes a region having predetermined brightness corresponding to a current having the predetermined value (the region superimposed with an anode, a hole transport layer, a light-emitting layer, an electron transport layer, and a cathode).

In FIG. 10B, the anode cover film 23 covers the edge of the anode 22c. Therefore, such a possibility can be reduced that the edge of the anode 22c and the cathode 25 are short-circuited.

Fourth Embodiment

Figure 12A:
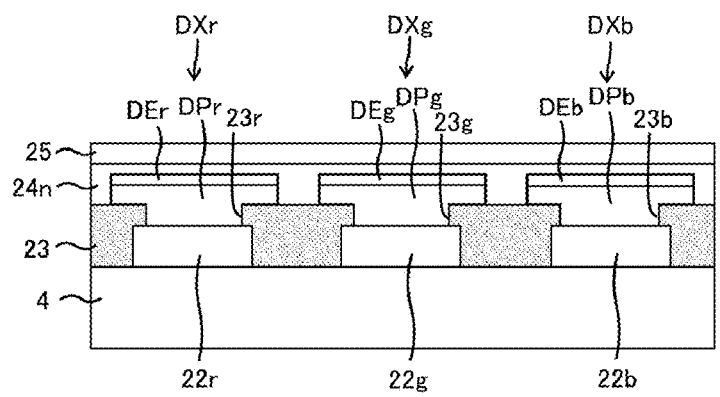
FIGS. 12A, 12B, and 12C illustrate a fourth embodiment.
Figure 12B:
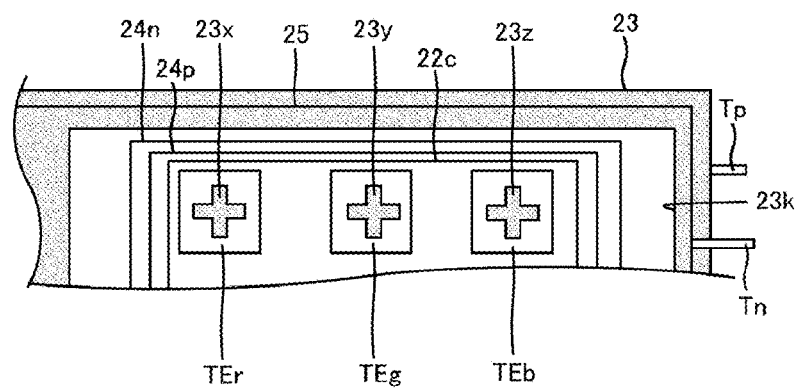
Figure 12C:
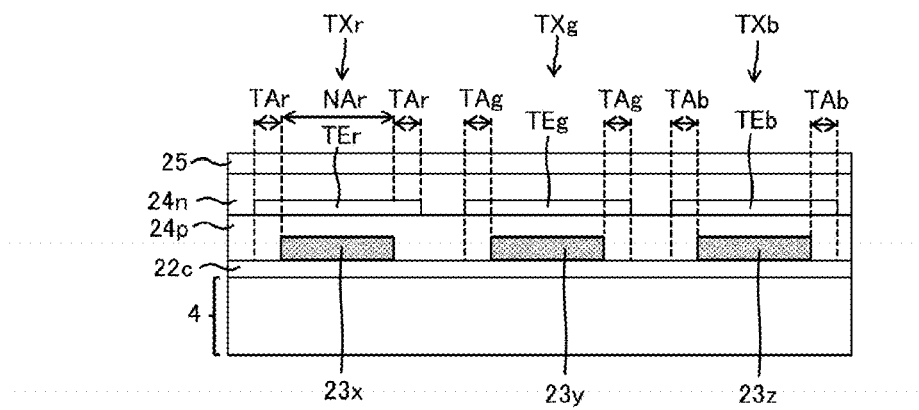

FIG. 12A is a cross-sectional view illustrating light-emitting elements for inspection purpose. FIG. 12B is a plan view illustrating the light-emitting elements for inspection purpose. FIG. 12C is a cross-sectional view illustrating light-emitting regions of the light-emitting elements for inspection purpose. In the fourth embodiment, a difference in position (difference in vapor-deposition) among light-emitting layers is detected.

As illustrated in FIGS. 12A, 12B, and 12C, the opening 23k of the anode cover film 23 wholly overlaps with the anode 22c. In a plain view, the light-emitting layers TEr, TEg, and TEb each having an island shape are formed inside the opening 23k of the anode cover film 23, an anode cover film 23x having a cross shape is formed inside the light-emitting layer TEr, an anode cover film 23y having a cross shape is formed inside the light-emitting layer TEg, and an anode cover film 23z having a cross shape is formed inside the light-emitting layer TEb.

As for the light-emitting element TXr for inspection purpose, the edge of the light-emitting layer TEr overlaps with the anode 22c without being interposed with the insulating film of the light-emitting element layer. The edge of the light-emitting layer TEr overlaps with the cathode 25 via the hole transport layer 24p and the electron transport layer 24n.

As illustrated in FIGS. 12A, 12B, and 12C, in the light-emitting element TXr for inspection purpose, the edge of the light-emitting layer TEr and an outer periphery of the light-emitting region TAr align with each other, generating, inside the outer periphery of the light-emitting region TAr, the non-light-emitting region NAr having a cross shape that aligns with the anode cover film 23x having a cross shape. When a current is allowed to flow from the anode 22c to the cathode 25, and the light-emitting element TXr is allowed to emit light to measure a positional relationship between the outer periphery of the light-emitting region TAr and the alignment mark (the non-light-emitting region NAr having a cross shape), a difference in position (alignment precision) of the light-emitting layer DEr vapor-deposited by using a single mask also used for the light-emitting layer TEr can be detected (alignment inspection in FIG. 1).

Supplement

An electro-optical element (an electro-optical element whose luminance and transmittance are controlled by an electric current) that is provided in the display device 2 according to the present embodiment is not particularly limited. Examples of the display device 2 according to the present embodiment include an organic electroluminescence (EL) display provided with the Organic Light Emitting Diode (OLED) as the electro-optical element, an inorganic EL display provided with an inorganic light emitting diode as the electro-optical element, and a Quantum dot Light Emitting Diode (QLED) display provided with a QLED as the electro-optical element.

Aspect 1

A display device includes a first light-emitting element including a first organic layer having an island shape, and a first lower electrode having an island shape, an electrode cover film having an insulating property, the electrode cover film covering an edge of the first lower electrode, and a second light-emitting element including a second organic layer having an island shape, the second organic layer being an identical layer to the first organic layer, and a second lower electrode having an island shape.

In the display device, an opening of the electrode cover film wholly overlaps with the first lower electrode and the first organic layer, so that the opening defines a light-emitting region of the first light-emitting element, and at least a part of an edge of the second organic layer overlaps with the second lower electrode without being interposed with an insulating film, and the edge of the second organic layer defines a light-emitting region of the second light-emitting element.

Aspect 2

In the display device according to aspect 1, for example, the second organic layer wholly overlaps with the second lower electrode and an upper electrode being an upper layer than the second organic layer.

Aspect 3

In the display device according to aspect 1 or 2, for example, a function layer is provided between the upper electrode being an upper layer than the second organic layer and the second lower electrode, and the second lower electrode wholly overlaps with the function layer.

Aspect 4

In the display device according to aspect 3, for example, the first organic layer and the second organic layer are light-emitting layers.

Aspect 5

In the display device according to aspect 3, for example, the first organic layer and the second organic layer are hole transport layers.

Aspect 6

The display device according to any one of aspects 1 to 5, for example, further includes a third light-emitting element including a third organic layer having an island shape, the third light-emitting element being an identical layer to the second organic layer.

In the display device, an edge of the third organic layer overlaps with the second lower electrode without being interposed with an insulating film, and the edge of the third organic layer defines a light-emitting region of the third light-emitting element.

Aspect 7

In the display device according to aspect 5, for example, an edge of the second lower electrode is covered with an insulating film being an identical layer to the electrode cover film, and the second organic layer wholly overlaps with an opening of the insulating film.

Aspect 8

In the display device according to aspect 5, for example, an insulating film having an island shape, the insulating film being an identical layer to the electrode cover film, is provided inside the edge of the second organic layer in a plain view.

Aspect 9

In the display device according to any one of aspects 1 to 7, for example, an alignment mark is formed in a thin film transistor (TFT) layer being a lower layer than the second light-emitting element.

Aspect 10

In the display device according to aspect 4, for example, the second light-emitting element is an organic light-emitting diode (OLED) including a hole transport layer, the second organic layer, and an electron transport layer, and at least either of the hole transport layer and the electron transport layer is the function layer.

Aspect 11

In the display device according to aspect 10, for example, the second organic layer wholly overlaps with the hole transport layer and the electron transport layer.

Aspect 12

In the display device according to aspect 5, for example, the second light-emitting element is an OLED including the second organic layer, a light-emitting layer, and an electron transport layer, and at least either of the light-emitting layer and the electron transport layer is the function layer.

Aspect 13

In the display device according to aspect 12, for example, the second organic layer wholly overlaps with the light-emitting layer and the electron transport layer.

Aspect 14

In the display device according to aspect 9, for example, the second organic layer and the alignment mark overlap with each other.

Aspect 15

In the display device according to any one of aspects 1 to 14, for example, the first organic layer and the second organic layer are respectively formed to have shapes identical to each other.

Aspect 16

In the display device according to aspect 15, for example, the light-emitting region of the second light-emitting element is greater than the light-emitting region of the first light-emitting element.

Aspect 17

In the display device according to any one of aspects 1 to 16, for example, the first light-emitting element is an light-emitting element for display purpose, and the second light-emitting element is a light-emitting element for inspection purpose.

Aspect 18

The display device according to any one of aspects 1 to 17, for example, includes a display region, and a frame region surrounding the display region.

In the display device, the first light-emitting element is formed in the display region, and the second light-emitting element is provided in the frame region.

Aspect 19

A method for manufacturing a display device including a first light-emitting element including a first organic layer having an island shape, and a first lower electrode, an electrode cover film having an insulating property, the electrode cover film covering an edge of the first lower electrode, and a second light-emitting element including a second organic layer having an island shape, the second organic layer being an identical layer to the first organic layer, and a second lower electrode. The method includes forming the first light-emitting element to allow an opening of the electrode cover film to each wholly overlaps with the first lower electrode and the first organic layer, and forming the second light-emitting element to allow an edge of the second organic layer to overlap with the second lower electrode without being interposed with an insulating film, and detecting a position of the second organic layer based on a position of a light-emitting region of the second light-emitting element. The light-emitting region is defined by the edge of the second organic layer.

Aspect 20

The method for manufacturing a display device, according to aspect 19, for example, includes using a single mask to vapor-deposit the first organic layer and the second organic layer.

Aspect 21

A display device manufacturing apparatus includes performing the method according to aspect 19, for example.

REFERENCE SIGNS LIST

2 Display device
3 Barrier layer
4 TFT layer
5 Light-emitting element layer
6 Sealing layer
12 Resin layer
16, 18, 20 Inorganic insulating film
21 Flattering film
22r, 22g, 22b Anode (first lower electrode)
22c Anode (second lower electrode)
23 Anode cover film (electrode cover film)
25 Cathode (upper electrode)
DXr Light-emitting element (first light-emitting element)
TXr Light-emitting element (second light-emitting element)
TXg Light-emitting element (third light-emitting element)
DEr, DEg, DEb Light-emitting layer (first organic layer)
TEr, TEg, TEb Light-emitting layer (second organic layer)
DPr, DPg, DPb Hole transport layer (first organic layer)
TPr, TPg, TPb Hole transport layer (second organic layer)

The invention claimed is:

1. A display device comprising:
a first light-emitting element including:
a first organic layer having an island shape, and
a first lower electrode having an island shape;
an electrode cover film having an insulating property, the electrode cover film covering an edge of the first lower electrode; and
a second light-emitting element including:
a second organic layer having an island shape, the second organic layer being an identical layer to the first organic layer, and
a second lower electrode having an island shape, wherein
an opening of the electrode cover film wholly overlaps with the first lower electrode and the first organic layer, so that the opening defines a light-emitting region of the first light-emitting element,
at least a portion of an outer peripheral edge of the second organic layer overlaps with the second lower electrode without being interposed by the electrode cover film, and the outer peripheral edge of the second organic layer defines a light-emitting region of the second light-emitting element, and an alignment mark is defined in a thin film transistor (TFT) layer that is a layer below the second light-emitting element.

2. The display device according to claim 1, wherein the second organic layer wholly overlaps with the second lower electrode and an upper electrode that is a layer above the second organic layer.

3. The display device according to claim 1, wherein
a function layer is provided between an upper electrode that is a layer above the second organic layer and the second lower electrode, and
the second lower electrode wholly overlaps with the function layer.

4. The display device according to claim 3, wherein the first organic layer and the second organic layer are light-emitting layers.

5. The display device according to claim 3, wherein the first organic layer and the second organic layer are hole transport layers.

6. The display device according to claim 1 further comprising:
a third light-emitting element including a third organic layer having an island shape, the third organic layer being an identical layer to the second organic layer,
wherein, an edge of the third organic layer overlaps with the second lower electrode without being interposed by the electrode cover film, and the edge of the third organic layer defines a light-emitting region of the third light-emitting element.

7. The display device according to claim 1, wherein
an edge of the second lower electrode is covered with the electrode cover film, and
the second organic layer wholly overlaps with an opening of the electrode cover film.

8. The display device according to claim 4, wherein
the second light-emitting element is an organic light-emitting diode (OLED) including
a hole transport layer,
the second organic layer, and
an electron transport layer, and
at least either of the hole transport layer and the electron transport layer is the function layer.

9. The display device according to claim 8, wherein the second organic layer wholly overlaps with the hole transport layer and the electron transport layer.

10. The display device according to claim 5, wherein
the second light-emitting element is an OLED including
the second organic layer,
a light-emitting layer, and
an electron transport layer, and
at least either of the light-emitting layer and the electron transport layer is the function layer.

11. The display device according to claim 10, wherein the second organic layer wholly overlaps with the light-emitting layer and the electron transport layer.

12. The display device according to claim 1, wherein the second organic layer and the alignment mark overlap with each other.

13. A display device comprising:
a first light-emitting element including:
a first organic layer having an island shape, and
a first lower electrode having an island shape;
an electrode cover film having an insulating property, the electrode cover film covering an edge of the first lower electrode; and
a second light-emitting element including:
a second organic layer having an island shape, the second organic layer being an identical layer to the first organic layer, and
a second lower electrode having an island shape, wherein
an opening of the electrode cover film wholly overlaps with the first lower electrode and the first organic layer, so that the opening defines a light-emitting region of the first light-emitting element,
at least a portion of an outer peripheral edge of the second organic layer overlaps with the second lower electrode without being interposed by the electrode cover film, and the outer peripheral edge of the second organic layer defines a light-emitting region of the second light-emitting element,
a function layer is provided between an upper electrode being a layer above the second organic layer and the second lower electrode,
the second lower electrode wholly overlaps with the function layer,
the first organic layer and the second organic layer are hole transport layers, and
the electrode cover film having an island shape is provided inside the outer peripheral edge of the second organic layer in a plan view.

14. The display device according to claim 13, wherein the second organic layer wholly overlaps with the second lower electrode and an upper electrode that is a layer above the second organic layer.

15. The display device according to claim 13 further comprising:
a third light-emitting element including a third organic layer having an island shape, the third organic layer being an identical layer to the second organic layer,
wherein, an edge of the third organic layer overlaps with the second lower electrode without being interposed by the electrode cover film, and the edge of the third organic layer defines a light-emitting region of the third light-emitting element.

16. The display device according to claim 13, wherein
an edge of the second lower electrode is covered with the electrode cover film, and
the second organic layer wholly overlaps with an opening of the electrode cover film.

17. The display device according to claim 13, wherein
the second light-emitting element is an OLED including
the second organic layer,
a light-emitting layer, and
an electron transport layer, and
at least either of the light-emitting layer and the electron transport layer is the function layer.

* * * * *